(12) United States Patent
Yan et al.

(10) Patent No.: US 12,176,746 B2
(45) Date of Patent: Dec. 24, 2024

(54) MONITORING METHOD, DEVICE, AND SYSTEM FOR LOW-VOLTAGE VEHICLE BATTERY, SERVER, AND MEDIUM

(71) Applicant: NIO TECHNOLOGY (ANHUI) CO., LTD, Hefei (CN)

(72) Inventors: Zhujun Yan, Shanghai (CN); Degang Xu, Shanghai (CN); Bohong Xiao, Shanghai (CN); Litao Fu, Shanghai (CN); Ming Chen, Shanghai (CN); Weichao Tian, Shanghai (CN)

(73) Assignee: NIO TECHNOLOGY (ANHUI) CO., LTD, Hefei (CN)

( * ) Notice: Subject to any disclaimer, the term of this patent is extended or adjusted under 35 U.S.C. 154(b) by 379 days.

(21) Appl. No.: 17/534,606

(22) Filed: Nov. 24, 2021

(65) Prior Publication Data
US 2022/0166238 A1    May 26, 2022

(30) Foreign Application Priority Data
Nov. 26, 2020  (CN) .......................... 202011348696.9

(51) Int. Cl.
*H02J 7/00* (2006.01)
*G01R 31/367* (2019.01)
(Continued)

(52) U.S. Cl.
CPC .......... *H02J 7/0048* (2020.01); *G01R 31/367* (2019.01); *G01R 31/371* (2019.01);
(Continued)

(58) Field of Classification Search
CPC .. H02J 7/0048; H02J 7/00032; H02J 7/00712; G01R 31/387; G01R 31/392;
(Continued)

(56) References Cited

U.S. PATENT DOCUMENTS

| 7,639,019 B2 * | 12/2009 | Bosse | G01R 31/371 324/426 |
| 9,285,432 B2 * | 3/2016 | Schwarz | H01M 10/44 |

(Continued)

FOREIGN PATENT DOCUMENTS

| CN | 107134821 | 9/2017 |
| CN | 109946615 | 6/2019 |

(Continued)

OTHER PUBLICATIONS

Official Action with English Translation for China Patent Application No. 202011348696.9, dated Jul. 13, 2024, 21 pages.
(Continued)

*Primary Examiner* — Luis A Martinez Borrero
(74) *Attorney, Agent, or Firm* — Sheridan Ross P.C.

(57) ABSTRACT

The invention relates to the field of vehicle battery monitoring technologies, and in particular to a monitoring method, apparatus, and system for a low-voltage vehicle battery, a server, and a medium, to solve a technical problem that a capacity of an existing low-voltage vehicle battery drops too much, which causes a vehicle to fail to be started. For this purpose, the monitoring method according to embodiments of the invention includes the following steps: step S101: obtaining, in response to a received battery anomaly analysis request, an electric energy-related parameter of the low-voltage vehicle battery from the battery anomaly analysis request; and step S102: determining, based on a result of comparison between the electric energy-related parameter and a preset electric energy parameter threshold, whether a capacity of the low-voltage vehicle battery is anomalous, where the battery anomaly analysis request is request information output by a vehicle device during a vehicle standstill and when it is detected that a battery voltage of the low-voltage vehicle battery is less than or equal to a preset voltage threshold. Through the foregoing
(Continued)

steps, the low-voltage vehicle battery whose capacity is anomalous can be identified in advance, so that a user can take measures in time.

12 Claims, 3 Drawing Sheets

(51) Int. Cl.
    *G01R 31/371*     (2019.01)
    *G01R 31/3835*     (2019.01)
    *G01R 31/387*     (2019.01)
    *G01R 31/392*     (2019.01)

(52) U.S. Cl.
    CPC ....... *G01R 31/3835* (2019.01); *G01R 31/387* (2019.01); *G01R 31/392* (2019.01); *H02J 7/00032* (2020.01); *H02J 7/00712* (2020.01)

(58) Field of Classification Search
    CPC . G01R 31/3835; G01R 31/367; G01R 31/371
    See application file for complete search history.

(56) References Cited

U.S. PATENT DOCUMENTS

| | | | |
|---|---|---|---|
| 10,654,366 B2* | 5/2020 | Miro-Padovani | B60W 10/06 |
| 11,187,753 B2* | 11/2021 | Gupta | G01R 31/3646 |
| 11,653,127 B2* | 5/2023 | Meißner | G07C 5/0808 |
| | | | 340/870.07 |
| 11,768,251 B2* | 9/2023 | Sung | G01R 31/3648 |
| | | | 701/33.6 |
| 2010/0026306 A1* | 2/2010 | Zhang | G01R 31/3647 |
| | | | 324/426 |
| 2011/0234167 A1* | 9/2011 | Kao | G01R 31/3828 |
| | | | 320/132 |
| 2011/0298417 A1* | 12/2011 | Stewart | H02J 7/0029 |
| | | | 320/132 |
| 2014/0225428 A1* | 8/2014 | Campbell | G01R 31/392 |
| | | | 324/426 |
| 2014/0229129 A1* | 8/2014 | Campbell | B60L 50/15 |
| | | | 702/63 |
| 2015/0115969 A1* | 4/2015 | Ishida | G01R 31/392 |
| | | | 324/426 |
| 2015/0120225 A1* | 4/2015 | Kim | G01R 31/392 |
| | | | 702/63 |
| 2016/0231388 A1* | 8/2016 | Park | G01R 31/3835 |
| 2016/0344206 A1* | 11/2016 | Ono | H02J 7/0031 |
| 2017/0242079 A1 | 8/2017 | Duan et al. | |
| 2018/0326859 A1* | 11/2018 | Oh | B60R 16/033 |
| 2019/0033376 A1* | 1/2019 | Jeong | G06F 17/11 |
| 2019/0184846 A1* | 6/2019 | Kang | B60L 58/12 |
| 2020/0158786 A1* | 5/2020 | Gupta | G01R 31/3646 |
| 2020/0376978 A1* | 12/2020 | Chen | H01M 10/44 |
| 2020/0400750 A1* | 12/2020 | Du | H01M 10/44 |
| 2021/0039519 A1* | 2/2021 | Lee | B60L 3/12 |
| 2022/0085631 A1* | 3/2022 | Shum | H02J 7/007182 |
| 2022/0144132 A1* | 5/2022 | Jin | H01M 10/425 |

FOREIGN PATENT DOCUMENTS

| | | |
|---|---|---|
| CN | 110907844 | 3/2020 |
| CN | 110962677 | 4/2020 |
| CN | 111731149 | 10/2020 |
| EP | 3364203 | 8/2018 |

OTHER PUBLICATIONS

Extended Search Report for European Patent Application No. 21210848.4, dated Apr. 19, 2022, 10 pages.

* cited by examiner

MONITORING METHOD, DEVICE, AND SYSTEM FOR LOW-VOLTAGE VEHICLE BATTERY, SERVER, AND MEDIUM

CROSS-REFERENCE TO RELATED APPLICATION

This application claims the benefit of China Patent Application No. 202011348696.9 filed Nov. 26, 2020, the entire contents of which are incorporated herein by reference in its entirety.

TECHNICAL FIELD

The invention relates to the field of vehicle battery monitoring technologies, and in particular to a monitoring method, device, and system for a low-voltage vehicle battery, a server, and a medium.

BACKGROUND ART

With the economic development and social progress, people's living standards are increasingly improved, and vehicles have gradually become an indispensable tool for people to travel. Compared with conventional fuel vehicles, new energy vehicles are becoming more and more popular among people for their advantages in saving energy sources such as petroleum and reducing pollution.

An electrical system of a new energy vehicle mainly includes a high-voltage electrical system and a low-voltage electrical system. The high-voltage electrical system mainly includes a traction battery for providing a power source for the new energy vehicle. The low-voltage electrical system mainly includes a low-voltage vehicle battery (for example, a 12 V lead-acid battery) for providing electric energy for related vehicle devices when the new energy vehicle is started. When the new energy vehicle is started, the low-voltage vehicle battery usually needs to supply power to different devices that implement functions such as vehicle control, traction battery monitoring, and head unit software upgrade. Therefore, the low-voltage vehicle battery consumes more electric energy. However, in comparison with a conventional fuel vehicle, the low-voltage vehicle battery in the new energy vehicle has a large quiescent sleep current. When the vehicle is at a standstill (devices in the vehicle are in a sleep state) for a long time, a capacity of the low-voltage vehicle battery is prone to drop so much that the vehicle cannot be provided with necessary electric energy when the vehicle is started, which causes the vehicle to fail to be started.

SUMMARY OF THE INVENTION

To overcome the foregoing defects, the invention is proposed to provide a monitoring method, device, and system for a low-voltage vehicle battery, a server, and a medium, to solve or at least partially solve a technical problem as follows: A capacity of an existing low-voltage vehicle battery is prone to drop so much that a vehicle cannot be provided with necessary electric energy when the vehicle is started, which causes the vehicle to fail to be started.

According to a first aspect, a monitoring method for a low-voltage vehicle battery is provided, where the monitoring method includes:
obtaining, in response to a received battery anomaly analysis request, an electric energy-related parameter of the low-voltage vehicle battery from the battery anomaly analysis request; and
determining, based on a result of comparison between the electric energy-related parameter and a preset electric energy parameter threshold, whether a capacity of the low-voltage vehicle battery is anomalous,
where the battery anomaly analysis request is request information output by a vehicle device during a vehicle standstill and when it is detected that a battery voltage of the low-voltage vehicle battery is less than or equal to a preset voltage threshold.

In a technical solution of the foregoing monitoring method, before the step of determining, based on a result of comparison between the electric energy-related parameter and a preset electric energy parameter threshold, whether a capacity of the low-voltage vehicle battery is anomalous, the monitoring method further includes:
obtaining a battery temperature of the low-voltage vehicle battery from the battery anomaly analysis request; and
obtaining, through matching based on a preset correspondence between a battery temperature and an electric energy parameter threshold, an electric energy parameter threshold corresponding to the battery temperature.

In a technical solution of the foregoing monitoring method, the step of determining, based on a result of comparison between the electric energy-related parameter and a preset electric energy parameter threshold, whether a capacity of the low-voltage vehicle battery is anomalous specifically includes:
the electric energy-related parameter includes a battery voltage and a state of charge of the low-voltage vehicle battery, and the electric energy parameter threshold includes a battery voltage threshold and a state of charge threshold; and
if the battery voltage is less than or equal to the battery voltage threshold and the state of charge is greater than or equal to the state of charge threshold, determining that the capacity of the low-voltage vehicle battery is anomalous.

In a technical solution of the foregoing monitoring method, the electric energy-related parameter in the battery anomaly analysis request is an electric energy-related parameter that is detected by the vehicle device at an instantaneous moment when charging of the low-voltage vehicle battery is started during the vehicle standstill and after it is detected that the battery voltage of the low-voltage vehicle battery is less than or equal to the preset voltage threshold.

In a technical solution of the foregoing monitoring method, after the step of determining, based on a result of comparison between the electric energy-related parameter and a preset electric energy parameter threshold, whether a capacity of the low-voltage vehicle battery is anomalous, the monitoring method further includes:
obtaining vehicle identification information from the battery anomaly analysis request if it is determined that the capacity of the low-voltage vehicle battery is anomalous, and sending alarm information to a vehicle service terminal and/or a vehicle user terminal based on the vehicle identification information.

In a technical solution of the foregoing monitoring method, the monitoring method further includes:
obtaining historical status data of a traction battery in a vehicle; and adjusting, based on the historical status data, a charging strategy for using the traction battery to charge the low-voltage vehicle battery, which specifically includes:

adjusting a charging voltage, a state of charge at the start of the charging, and a state of charge at the end of the charging of the low-voltage vehicle battery based on the historical status data, where the historical status data includes a service life and a mileage of the traction battery as well as charging duration and a temperature of the low-voltage vehicle battery when the traction battery is used to charge the low-voltage vehicle battery.

According to a second aspect, another monitoring method for a low-voltage vehicle battery is provided, where the monitoring method includes:

detecting, during a vehicle standstill, whether a battery voltage of the low-voltage vehicle battery is less than or equal to a preset voltage threshold; and if the battery voltage of the low-voltage vehicle battery is less than or equal to the preset voltage threshold, generating a battery anomaly analysis request based on an electric energy-related parameter of the low-voltage vehicle battery, and sending the battery anomaly analysis request to a background server, so that the background server can determine, based on a result of comparison between the electric energy-related parameter and a preset electric energy parameter threshold, whether a capacity of the low-voltage vehicle battery is anomalous.

In a technical solution of the foregoing monitoring method, the step of generating a battery anomaly analysis request based on an electric energy-related parameter of the low-voltage vehicle battery specifically includes:

obtaining a battery temperature and the electric energy-related parameter of the low-voltage vehicle battery, and vehicle identification information of a current vehicle; and generating the battery anomaly analysis request based on the battery temperature, the electric energy-related parameter, and the vehicle identification information, so that the background server can obtain, through matching based on a preset correspondence between a battery temperature and an electric energy parameter threshold, an electric energy parameter threshold corresponding to the battery temperature, and determine, based on a result of comparison between the electric energy-related parameter and the electric energy parameter threshold, whether the capacity of the low-voltage vehicle battery is anomalous.

In a technical solution of the foregoing monitoring method, after the step of sending the battery anomaly analysis request to a background server, the monitoring method further includes:

receiving alarm information sent by the background server, where the alarm information is information sent by the background server after the background server determines that the capacity of the low-voltage vehicle battery is anomalous.

In a technical solution of the foregoing monitoring method, the electric energy-related parameter includes the battery voltage and a state of charge of the low-voltage vehicle battery, where the electric energy-related parameter is an electric energy-related parameter that is detected at an instantaneous moment when charging of the low-voltage vehicle battery is started during the vehicle standstill and after it is detected that the battery voltage of the low-voltage vehicle battery is less than or equal to the preset voltage threshold.

According to a third aspect, a background server is provided, where the background server includes:

a battery anomaly analysis request receiving module configured to obtain, in response to a received battery anomaly analysis request, an electric energy-related parameter of a low-voltage vehicle battery from the battery anomaly analysis request; and a battery anomaly analysis request processing module configured to determine, based on a result of comparison between the electric energy-related parameter and a preset electric energy parameter threshold, whether a capacity of the low-voltage vehicle battery is anomalous, where the battery anomaly analysis request is request information output by a vehicle device during a vehicle standstill and when it is detected that a battery voltage of the low-voltage vehicle battery is less than or equal to a preset voltage threshold.

In a technical solution of the foregoing background server, before the step of determining, based on a result of comparison between the electric energy-related parameter and a preset electric energy parameter threshold, whether a capacity of the low-voltage vehicle battery is anomalous, the battery anomaly analysis request processing module is further configured to perform the following steps:

obtaining a battery temperature of the low-voltage vehicle battery from the battery anomaly analysis request; and obtaining, through matching based on a preset correspondence between a battery temperature and an electric energy parameter threshold, an electric energy parameter threshold corresponding to the battery temperature.

In a technical solution of the foregoing background server, the battery anomaly analysis request processing module is further configured to perform the following step:

the electric energy-related parameter includes a battery voltage and a state of charge of the low-voltage vehicle battery, and the electric energy parameter threshold includes a battery voltage threshold and a state of charge threshold; and if the battery voltage is less than or equal to the battery voltage threshold and the state of charge is greater than or equal to the state of charge threshold, determining that the capacity of the low-voltage vehicle battery is anomalous.

In a technical solution of the foregoing background server, the electric energy-related parameter in the battery anomaly analysis request is an electric energy-related parameter that is detected by the vehicle device at an instantaneous moment when charging of the low-voltage vehicle battery is started during the vehicle standstill and after it is detected that the battery voltage of the low-voltage vehicle battery is less than or equal to the preset voltage threshold.

In a technical solution of the foregoing background server, after the step of determining, based on a result of comparison between the electric energy-related parameter and a preset electric energy parameter threshold, whether a capacity of the low-voltage vehicle battery is anomalous, the battery anomaly analysis request processing module is further configured to perform the following steps:

obtaining vehicle identification information from the battery anomaly analysis request if it is determined that the capacity of the low-voltage vehicle battery is anomalous, and sending alarm information to a vehicle service terminal and/or a vehicle user terminal based on the vehicle identification information.

In a technical solution of the foregoing background server, the background server further includes a low-voltage vehicle battery charging strategy adjustment module, and the low-voltage vehicle battery charging strategy adjustment module is configured to perform the following steps:

obtaining historical status data of a traction battery in a vehicle; and adjusting, based on the historical status data, a charging strategy for using the traction battery to charge the low-voltage vehicle battery, which specifically includes:

adjusting a charging voltage, a state of charge at the start of the charging, and a state of charge at the end of the charging of the low-voltage vehicle battery based on the historical status data, where the historical status data includes a service life and a mileage of the traction battery as well as charging duration and a temperature of the low-voltage vehicle battery when the traction battery is used to charge the low-voltage vehicle battery.

According to a fourth aspect, a monitoring device for a low-voltage vehicle battery is provided, where the monitoring device includes:

a battery voltage detection module configured to detect, during a vehicle standstill, whether a battery voltage of the low-voltage vehicle battery is less than or equal to a preset voltage threshold; and a battery anomaly analysis request module configured to: when the battery voltage detection module detects that the battery voltage of the low-voltage vehicle battery is less than or equal to the preset voltage threshold, generate a battery anomaly analysis request based on an electric energy-related parameter of the low-voltage vehicle battery, and send the battery anomaly analysis request to a background server, so that the background server can determine, based on a result of comparison between the electric energy-related parameter and a preset electric energy parameter threshold, whether a capacity of the low-voltage vehicle battery is anomalous.

In a technical solution of the foregoing monitoring device, the battery anomaly analysis request module is further configured to perform the following steps:

obtaining a battery temperature and the electric energy-related parameter of the low-voltage vehicle battery, and vehicle identification information of a current vehicle; and generating the battery anomaly analysis request based on the battery temperature, the electric energy-related parameter, and the vehicle identification information, so that the background server can obtain, through matching based on a preset correspondence between a battery temperature and an electric energy parameter threshold, an electric energy parameter threshold corresponding to the battery temperature, and determine, based on a result of comparison between the electric energy-related parameter and the electric energy parameter threshold, whether the capacity of the low-voltage vehicle battery is anomalous.

In a technical solution of the foregoing monitoring device, after the step of sending the battery anomaly analysis request to a background server, the battery anomaly analysis request module is further configured to perform the following step:

receiving alarm information sent by the background server, where the alarm information is information sent by the background server after the background server determines that the capacity of the low-voltage vehicle battery is anomalous.

In a technical solution of the foregoing monitoring device, the electric energy-related parameter includes the battery voltage and a state of charge of the low-voltage vehicle battery, where the electric energy-related parameter is an electric energy-related parameter that is detected at an instantaneous moment when charging of the low-voltage vehicle battery is started during the vehicle standstill and after it is detected that the battery voltage of the low-voltage vehicle battery is less than or equal to the preset voltage threshold.

In a technical solution of the foregoing monitoring device, the battery voltage detection module includes a body control module, and the battery anomaly analysis request module includes a vehicle control unit.

According to a fifth aspect, a monitoring system for a low-voltage vehicle battery is provided, where the monitoring system includes the background server according to any one of the foregoing technical solutions and the monitoring device for the low-voltage vehicle battery according to any one of the foregoing technical solutions;

the monitoring device is configured to: detect, during a vehicle standstill, whether a battery voltage of the low-voltage vehicle battery is less than or equal to a preset voltage threshold; and if the battery voltage of the low-voltage vehicle battery is less than or equal to the preset voltage threshold, generate a battery anomaly analysis request based on an electric energy-related parameter of the low-voltage vehicle battery, and send the battery anomaly analysis request to the background server; and the background server is configured to: obtain the electric energy-related parameter of the low-voltage vehicle battery from the battery anomaly analysis request, and determine, based on a result of comparison between the electric energy-related parameter and a preset electric energy parameter threshold, whether a capacity of the low-voltage vehicle battery is anomalous.

According to a sixth aspect, a control device is provided, where the control device includes a processor and a storage device, the storage device is adapted to store a plurality of program codes, and the program codes are adapted to be loaded and run by the processor to perform the monitoring method for the low-voltage vehicle battery according to any one of the technical solutions of the foregoing first aspect.

According to a seventh aspect, a control device is provided, where the control device includes a processor and a storage device, the storage device is adapted to store a plurality of program codes, and the program codes are adapted to be loaded and run by the processor to perform the monitoring method for the low-voltage vehicle battery according to any one of the technical solutions of the foregoing second aspect.

According to an eighth aspect, a computer-readable storage medium is provided, where the computer-readable storage medium stores a plurality of program codes, and the program codes are adapted to be loaded and run by a processor to perform the monitoring method for the low-voltage vehicle battery according to any one of the technical solutions of the foregoing first aspect.

According to a ninth aspect, a computer-readable storage medium is provided, where the computer-readable storage medium stores a plurality of program codes, and the program codes are adapted to be loaded and run by a processor to perform the monitoring method for the low-voltage vehicle battery according to any one of the technical solutions of the foregoing second aspect.

Solution 1. A monitoring method for a low-voltage vehicle battery, wherein the monitoring method includes:
obtaining, in response to a received battery anomaly analysis request, an electric energy-related parameter of the low-voltage vehicle battery from the battery anomaly analysis request; and
determining, based on a result of comparison between the electric energy-related parameter and a preset electric energy parameter threshold, whether a capacity of the low-voltage vehicle battery is anomalous,
where the battery anomaly analysis request is request information output by a vehicle device during a vehicle standstill and when it is detected that a battery voltage of the low-voltage vehicle battery is less than or equal to a preset voltage threshold.

Solution 2. The monitoring method for the low-voltage vehicle battery according to solution 1, wherein before the step of determining, based on a result of comparison between the electric energy-related parameter and a preset electric energy parameter threshold, whether a capacity of the low-voltage vehicle battery is anomalous, the monitoring method further includes:
obtaining a battery temperature of the low-voltage vehicle battery from the battery anomaly analysis request; and
obtaining, through matching based on a preset correspondence between a battery temperature and an electric energy parameter threshold, an electric energy parameter threshold corresponding to the battery temperature.

Solution 3. The monitoring method for the low-voltage vehicle battery according to solution 1, wherein the step of determining, based on a result of comparison between the electric energy-related parameter and a preset electric energy parameter threshold, whether a capacity of the low-voltage vehicle battery is anomalous specifically includes:
the electric energy-related parameter includes a battery voltage and a state of charge of the low-voltage vehicle battery, and the electric energy parameter threshold includes a battery voltage threshold and a state of charge threshold; and
if the battery voltage is less than or equal to the battery voltage threshold and the state of charge is greater than or equal to the state of charge threshold, determining that the capacity of the low-voltage vehicle battery is anomalous.

Solution 4. The monitoring method for the low-voltage vehicle battery according to solution 3, wherein the electric energy-related parameter in the battery anomaly analysis request is an electric energy-related parameter that is detected by the vehicle device at an instantaneous moment when charging of the low-voltage vehicle battery is started during the vehicle standstill and after it is detected that the battery voltage of the low-voltage vehicle battery is less than or equal to the preset voltage threshold.

Solution 5. The monitoring method for the low-voltage vehicle battery according to any one of solutions 1 to 4, wherein after the step of determining, based on a result of comparison between the electric energy-related parameter and a preset electric energy parameter threshold, whether a capacity of the low-voltage vehicle battery is anomalous, the monitoring method further includes:
obtaining vehicle identification information from the battery anomaly analysis request if it is determined that the capacity of the low-voltage vehicle battery is anomalous, and sending alarm information to a vehicle service terminal and/or a vehicle user terminal based on the vehicle identification information.

Solution 6. The monitoring method for the low-voltage vehicle battery according to any one of solutions 1 to 4, wherein the monitoring method further includes:
obtaining historical status data of a traction battery in a vehicle; and
adjusting, based on the historical status data, a charging strategy for using the traction battery to charge the low-voltage vehicle battery, which specifically includes:
adjusting a charging voltage, a state of charge at the start of the charging, and a state of charge at the end of the charging of the low-voltage vehicle battery based on the historical status data,
where the historical status data includes a service life and a mileage of the traction battery as well as charging duration and a temperature of the low-voltage vehicle battery when the traction battery is used to charge the low-voltage vehicle battery.

Solution 7. A monitoring method for a low-voltage vehicle battery, wherein the monitoring method includes:
detecting, during a vehicle standstill, whether a battery voltage of the low-voltage vehicle battery is less than or equal to a preset voltage threshold; and
if the battery voltage of the low-voltage vehicle battery is less than or equal to the preset voltage threshold, generating a battery anomaly analysis request based on an electric energy-related parameter of the low-voltage vehicle battery, and sending the battery anomaly analysis request to a background server, so that the background server can determine, based on a result of comparison between the electric energy-related parameter and a preset electric energy parameter threshold, whether a capacity of the low-voltage vehicle battery is anomalous.

Solution 8. The monitoring method for the low-voltage vehicle battery according to solution 7, wherein the step of generating a battery anomaly analysis request based on an electric energy-related parameter of the low-voltage vehicle battery specifically includes:
obtaining a battery temperature and the electric energy-related parameter of the low-voltage vehicle battery, and vehicle identification information of a current vehicle; and
generating the battery anomaly analysis request based on the battery temperature, the electric energy-related parameter, and the vehicle identification information, so that the background server can obtain, through matching based on a preset correspondence between a battery temperature and an electric energy parameter threshold, an electric energy parameter threshold corresponding to the battery temperature, and determine, based on a result of comparison between the electric energy-related parameter and the electric energy parameter threshold, whether the capacity of the low-voltage vehicle battery is anomalous.

Solution 9. The monitoring method for the low-voltage vehicle battery according to solution 7, wherein after the step of sending the battery anomaly analysis request to a background server, the monitoring method further includes:
receiving alarm information sent by the background server,
where the alarm information is information sent by the background server after the background server determines that the capacity of the low-voltage vehicle battery is anomalous.

Solution 10. The monitoring method for the low-voltage vehicle battery according to any one of solutions 7 to 9, wherein the electric energy-related parameter includes the battery voltage and a state of charge of the low-voltage vehicle battery, where the electric energy-related parameter is an electric energy-related parameter that is detected at an instantaneous moment when charging of the low-voltage vehicle battery is started during the vehicle standstill and after it is detected that the battery voltage of the low-voltage vehicle battery is less than or equal to the preset voltage threshold.

Solution 11. A background server, wherein the background server includes:
- a battery anomaly analysis request receiving module configured to obtain, in response to a received battery anomaly analysis request, an electric energy-related parameter of a low-voltage vehicle battery from the battery anomaly analysis request; and
- a battery anomaly analysis request processing module configured to determine, based on a result of comparison between the electric energy-related parameter and a preset electric energy parameter threshold, whether a capacity of the low-voltage vehicle battery is anomalous,
- where the battery anomaly analysis request is request information output by a vehicle device during a vehicle standstill and when it is detected that a battery voltage of the low-voltage vehicle battery is less than or equal to a preset voltage threshold.

Solution 12. The background server according to solution 11, wherein the battery anomaly analysis request processing module is further configured to perform the following steps:
- obtaining a battery temperature of the low-voltage vehicle battery from the battery anomaly analysis request; and
- obtaining, through matching based on a preset correspondence between a battery temperature and an electric energy parameter threshold, an electric energy parameter threshold corresponding to the battery temperature.

Solution 13. The background server according to solution 11, wherein the battery anomaly analysis request processing module is further configured to perform the following step:
- the electric energy-related parameter includes a battery voltage and a state of charge of the low-voltage vehicle battery, and the electric energy parameter threshold includes a battery voltage threshold and a state of charge threshold; and
- if the battery voltage is less than or equal to the battery voltage threshold and the state of charge is greater than or equal to the state of charge threshold, determining that the capacity of the low-voltage vehicle battery is anomalous.

Solution 14. The background server according to solution 13, wherein the electric energy-related parameter in the battery anomaly analysis request is an electric energy-related parameter that is detected by the vehicle device at an instantaneous moment when charging of the low-voltage vehicle battery is started during the vehicle standstill and after it is detected that the battery voltage of the low-voltage vehicle battery is less than or equal to the preset voltage threshold.

Solution 15. The background server according to any one of solutions 11 to 14, wherein the battery anomaly analysis request processing module is further configured to perform the following steps:
- obtaining vehicle identification information from the battery anomaly analysis request if it is determined that the capacity of the low-voltage vehicle battery is anomalous, and sending alarm information to a vehicle service terminal and/or a vehicle user terminal based on the vehicle identification information.

Solution 16. The background server according to any one of solutions 11 to 14, wherein the background server further includes a low-voltage vehicle battery charging strategy adjustment module, and the low-voltage vehicle battery charging strategy adjustment module is configured to perform the following steps:
- obtaining historical status data of a traction battery in a vehicle; and
- adjusting, based on the historical status data, a charging strategy for using the traction battery to charge the low-voltage vehicle battery, which specifically includes:
- adjusting a charging voltage, a state of charge at the start of the charging, and a state of charge at the end of the charging of the low-voltage vehicle battery based on the historical status data,
- where the historical status data includes a service life and a mileage of the traction battery as well as charging duration and a temperature of the low-voltage vehicle battery when the traction battery is used to charge the low-voltage vehicle battery.

Solution 17. A monitoring device for a low-voltage vehicle battery, wherein the monitoring device includes:
- a battery voltage detection module configured to detect, during a vehicle standstill, whether a battery voltage of the low-voltage vehicle battery is less than or equal to a preset voltage threshold; and
- a battery anomaly analysis request module configured to: when the battery voltage detection module detects that the battery voltage of the low-voltage vehicle battery is less than or equal to the preset voltage threshold, generate a battery anomaly analysis request based on an electric energy-related parameter of the low-voltage vehicle battery, and send the battery anomaly analysis request to a background server, so that the background server can determine, based on a result of comparison between the electric energy-related parameter and a preset electric energy parameter threshold, whether a capacity of the low-voltage vehicle battery is anomalous.

Solution 18. The monitoring device according to solution 17, wherein the battery anomaly analysis request module is further configured to perform the following steps:
- obtaining a battery temperature and the electric energy-related parameter of the low-voltage vehicle battery, and vehicle identification information of a current vehicle; and
- generating the battery anomaly analysis request based on the battery temperature, the electric energy-related parameter, and the vehicle identification information, so that the background server can obtain, through matching based on a preset correspondence between a battery temperature and an electric energy parameter threshold, an electric energy parameter threshold corresponding to the battery temperature, and determine, based on a result of comparison between the electric energy-related parameter and the electric energy parameter threshold, whether the capacity of the low-voltage vehicle battery is anomalous.

Solution 19. The monitoring device according to solution 17, wherein after the step of sending the battery anomaly analysis request to a background server, the battery anomaly analysis request module is further configured to perform the following step:

receiving alarm information sent by the background server,
where the alarm information is information sent by the background server after the background server determines that the capacity of the low-voltage vehicle battery is anomalous.

Solution 20. The monitoring device according to any one of solutions 17 to 19, wherein the electric energy-related parameter includes the battery voltage and a state of charge of the low-voltage vehicle battery, where the electric energy-related parameter is an electric energy-related parameter that is detected at an instantaneous moment when charging of the low-voltage vehicle battery is started during the vehicle standstill and after it is detected that the battery voltage of the low-voltage vehicle battery is less than or equal to the preset voltage threshold.

Solution 21. The monitoring device according to solution 20, wherein the battery voltage detection module includes a body control module, and the battery anomaly analysis request module includes a vehicle control unit.

Solution 22. A monitoring system for a low-voltage vehicle battery, wherein the monitoring system includes the background server according to any one of solutions 11 to 16 and the monitoring device for the low-voltage vehicle battery according to any one of solutions 17 to 21;
the monitoring device is configured to: detect, during a vehicle standstill, whether a battery voltage of the low-voltage vehicle battery is less than or equal to a preset voltage threshold; and if the battery voltage of the low-voltage vehicle battery is less than or equal to the preset voltage threshold, generate a battery anomaly analysis request based on an electric energy-related parameter of the low-voltage vehicle battery, and send the battery anomaly analysis request to the background server; and
the background server is configured to: obtain the electric energy-related parameter of the low-voltage vehicle battery from the battery anomaly analysis request, and determine, based on a result of comparison between the electric energy-related parameter and a preset electric energy parameter threshold, whether a capacity of the low-voltage vehicle battery is anomalous.

Solution 23. A control device, including a processor and a storage device, the storage device being adapted to store a plurality of program codes, wherein the program codes are adapted to be loaded and run by the processor to perform the monitoring method for the low-voltage vehicle battery according to any one of solutions 1 to 6.

Solution 24. A control device, including a processor and a storage device, the storage device being adapted to store a plurality of program codes, wherein the program codes are adapted to be loaded and run by the processor to perform the monitoring method for the low-voltage vehicle battery according to any one of solutions 7 to 10.

Solution 25. A computer-readable storage medium, storing a plurality of program codes, wherein the program codes are adapted to be loaded and run by a processor to perform the monitoring method for the low-voltage vehicle battery according to any one of solutions 1 to 6.

Solution 26. A computer-readable storage medium, storing a plurality of program codes, wherein the program codes are adapted to be loaded and run by a processor to perform the monitoring method for the low-voltage vehicle battery according to any one of solutions 7 to 10.

The foregoing one or more technical solutions of the invention have at least one or more of the following beneficial effects:

During implementation of the technical solutions of the invention, the battery anomaly analysis request can be output by the vehicle device during the vehicle standstill and when it is detected that the battery voltage of the low-voltage vehicle battery is less than or equal to the preset voltage threshold, and the electric energy-related parameter (including but not limited to the battery voltage and the state of charge) of the low-voltage vehicle battery is obtained from the battery anomaly analysis request, so that whether the capacity of the low-voltage vehicle battery is anomalous can be determined based on the result of comparison between the electric energy-related parameter and the preset electric energy parameter threshold. Specifically, if the battery voltage is less than or equal to the battery voltage threshold and the state of charge is greater than or equal to the state of charge threshold, it is determined that the capacity of the low-voltage vehicle battery is anomalous. In this way, the low-voltage vehicle battery whose capacity is anomalous can be identified in advance, so that a user can take measures in time, thereby avoiding the following case: The vehicle cannot be normally started due to the anomalous capacity of the low-voltage vehicle battery.

BRIEF DESCRIPTION OF THE DRAWINGS

Specific implementations of the invention are described below with reference to the accompanying drawings, in which.

LIST OF REFERENCE NUMERALS

Figure 1:
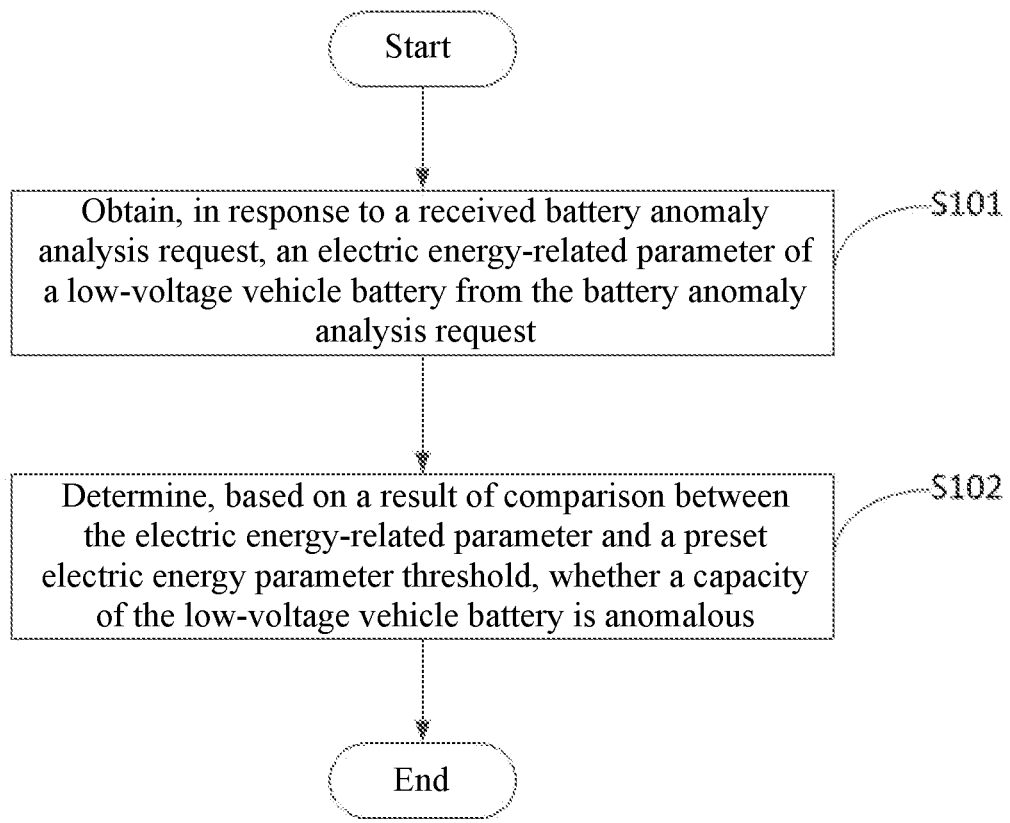
FIG. 1 is a schematic flowchart of main steps of a monitoring method for a low-voltage vehicle battery according to Embodiment 1 of the invention.

11: battery anomaly analysis request receiving module; 12: battery anomaly analysis request processing module; 13: low-voltage vehicle battery charging strategy adjustment module; 21: battery voltage detection module; and 22: battery anomaly analysis request module.

DETAILED DESCRIPTION OF EMBODIMENTS

Some implementations of the invention are described below with reference to the accompanying drawings. It should be understood by those skilled in the art that these embodiments are only for explaining the technical principles of the invention and are not intended to limit the scope of protection of the invention.

In the description of the invention, a "module" and a "processor" may include hardware, software, or a combination thereof. A module may include a hardware circuit, various suitable sensors, a communication port, and a memory, or may include a software part, such as program code, or may be a combination of software and hardware. The processor may be a central processing unit, a microprocessor, a graphics processing unit, a digital signal processor, or any other suitable processor. The processor has a data and/or signal processing function. The processor may be implemented in software, hardware, or a combination thereof. A non-transitory computer-readable storage medium includes any suitable medium that can store program code, such as a magnetic disk, a hard disk, an optical disc, a flash memory, a read-only memory, or a random access memory. The term "A and/or B" indicates all possible combinations of A and B, for example, only A, only B, or A and B. The term "at least one of A or B" or "at least one of A and B" has a meaning similar to "A and/or B" and may include only A, only B, or A and B. The terms "a/an" and "this" in the singular form may also include the plural form.

Some terms involved in the invention are explained herein first.

Vehicle standstill means that a vehicle remains still at a fixed position within a certain period of time. In this case, devices of the vehicle are in a sleep state, which includes but is not limited to: a state in which the vehicle is parked with an engine shut down and a state in which the vehicle enters a sleep state or a deep sleep state.

Currently, an electrical system of a conventional new energy vehicle mainly includes a high-voltage electrical system and a low-voltage electrical system. The high-voltage electrical system mainly includes a traction battery for providing a power source for the new energy vehicle. The low-voltage electrical system mainly includes a low-voltage vehicle battery (for example, a 12 V lead-acid battery) for providing electric energy for related vehicle devices when the new energy vehicle is started. When the new energy vehicle is started, the low-voltage vehicle battery usually needs to supply power to different devices that implement functions such as vehicle control, traction battery monitoring, and head unit software upgrade. Therefore, the low-voltage vehicle battery consumes more electric energy. However, in comparison with a conventional fuel vehicle, the low-voltage vehicle battery in the new energy vehicle has a large quiescent sleep current. When the vehicle is at a standstill (devices in the vehicle are in a sleep state) for a long time, a capacity of the low-voltage vehicle battery is prone to drop so much that the vehicle cannot be provided with necessary electric energy when the vehicle is started, which causes the vehicle to fail to be started.

In the embodiments of the invention, a battery anomaly analysis request output by a vehicle device can be obtained in advance, where the request is output by the vehicle device during a vehicle standstill and when it is detected that a battery voltage of a low-voltage vehicle battery is less than or equal to a preset voltage threshold; then, an electric energy-related parameter of the low-voltage vehicle battery is obtained from the battery anomaly analysis request; and finally, whether a capacity of the low-voltage vehicle battery is anomalous can be determined based on a result of comparison between the electric energy-related parameter and a preset electric energy parameter threshold. Through the foregoing steps, the low-voltage vehicle battery whose capacity is anomalous can be identified in advance, so that a user can take measures in time, thereby overcoming a defect that a vehicle cannot be normally started due to the anomalous capacity of the low-voltage vehicle battery.

In an application scenario of the invention, when a vehicle is parked in a parking garage in a shut-down state, a body control module (BCM) detects a battery voltage of a low-voltage vehicle battery in real time. When detecting that the battery voltage of the low-voltage vehicle battery is less than or equal to a preset voltage threshold, the body control module immediately wakes up a vehicle control unit (VCU). After being waken up, the vehicle control unit communicates with an intelligent battery sensor (IBS) of the low-voltage vehicle battery, to obtain electric energy-related parameters such as a battery voltage and a state of charge of the low-voltage vehicle battery that are collected by the battery management system. Then the vehicle control unit generates a battery anomaly analysis request based on the electric energy-related parameters of the low-voltage vehicle battery, and transmits the battery anomaly analysis request to a background server. After receiving the battery anomaly analysis request, the background server obtains a battery temperature, the battery voltage, and the state of charge of the low-voltage vehicle battery from the battery anomaly analysis request; then obtains, through matching based on a preset correspondence between a battery temperature and an electric energy parameter threshold (including a battery voltage threshold and a state of charge threshold), a battery voltage threshold and a state of charge threshold that correspond to the detected battery temperature; and finally determines, based on a result of comparison between the electric energy-related parameters in the battery anomaly analysis request and the obtained electric energy parameter thresholds, whether the low-voltage vehicle battery is anomalous. If the battery voltage is less than or equal to the battery voltage threshold and the state of charge is greater than or equal to the state of charge threshold, the background server determines that the capacity of the low-voltage vehicle battery is anomalous, and sends alarm information to a display of the vehicle and a mobile phone of a user based on vehicle identification information in the battery anomaly analysis request, so that the user can replace the low-voltage vehicle battery in time, and a manufacturer can adjust, based on historical status data of a traction battery in the vehicle, a charging strategy for using the traction battery to charge the low-voltage vehicle battery, thereby prolonging a service life of the low-voltage vehicle battery.

The technical solutions of the invention are further described below with reference to different embodiments.

Embodiment 1

Referring to FIG. 1, FIG. 1 is a schematic flowchart of main steps of a monitoring method for a low-voltage vehicle battery according to an embodiment of the invention. As shown in FIG. 1, the monitoring method in this embodiment of the invention mainly includes the following steps.

In step S101, in response to a received battery anomaly analysis request, an electric energy-related parameter of the low-voltage vehicle battery is obtained from the battery anomaly analysis request, where the battery anomaly analysis request is request information output by a vehicle device during a vehicle standstill and when it is detected that a battery voltage of the low-voltage vehicle battery is less than or equal to a preset voltage threshold.

In this embodiment, "vehicle standstill" has a same meaning as that in the foregoing term explanation. For brevity, details are not described herein again. The preset voltage threshold may be flexibly set by those skilled in the art according to actual requirements.

In step S102, whether a capacity of the low-voltage vehicle battery is anomalous is determined based on a result of comparison between the electric energy-related parameter and a preset electric energy parameter threshold.

In this embodiment, the electric energy-related parameter includes but is not limited to: a battery voltage and a state of charge (SOC) of the low-voltage vehicle battery. The preset electric energy parameter threshold may be flexibly set by those skilled in the art according to actual requirements.

Through the foregoing steps S101 and S102, in this embodiment of the invention, during the vehicle standstill and when it is detected that the battery voltage of the low-voltage vehicle battery is less than or equal to the preset voltage threshold, it is determined that the capacity of the low-voltage vehicle battery may be anomalous. Therefore, the electric energy-related parameters such as the battery voltage and the state of charge of the low-voltage vehicle battery are immediately obtained, and the battery anomaly analysis request is output based on the electric energy-related parameters. After receiving the battery anomaly analysis request, a device, for example, a background server, determines, based on a result of comparison between the electric energy-related parameter of the low-voltage vehicle battery in the battery anomaly analysis request and the preset electric energy parameter threshold, whether the capacity of the low-voltage vehicle battery is anomalous, and selectively outputs alarm information based on a determination result. Therefore, the low-voltage vehicle battery whose capacity is anomalous can be identified in advance, so that a user can take measures in time, thereby overcoming a defect that a vehicle cannot be normally started due to the anomalous capacity of the low-voltage vehicle battery.

The foregoing step S102 is further described below.

In an optional implementation of step S102 in this embodiment of the invention, before the step (step S102) of determining, based on a result of comparison between the electric energy-related parameter and a preset electric energy parameter threshold, whether a capacity of the low-voltage vehicle battery is anomalous, the foregoing monitoring method further includes: obtaining a battery temperature of the low-voltage vehicle battery from the battery anomaly analysis request; and obtaining, through matching based on a preset correspondence between a battery temperature and an electric energy parameter threshold, an electric energy parameter threshold corresponding to the battery temperature. In this implementation, different battery temperatures of the low-voltage vehicle battery respectively correspond to different electric energy parameter thresholds, and therefore, an electric energy parameter threshold, used in the case of a normal battery capacity, corresponding to the battery temperature of the low-voltage vehicle battery in the battery anomaly analysis request can be obtained based on the preset correspondence between a battery temperature and an electric energy parameter threshold. The preset correspondence between a battery temperature and an electric energy parameter threshold may be flexibly set by those skilled in the art according to actual requirements. For example, when a battery temperature of the low-voltage vehicle battery is 25° C., a corresponding battery voltage is 12.5 V, and a corresponding state of charge (SOC) is 0.9.

In an implementation, the step (step S102) of determining, based on a result of comparison between the electric energy-related parameter and a preset electric energy parameter threshold, whether a capacity of the low-voltage vehicle battery is anomalous specifically includes: the electric energy-related parameter includes a battery voltage and a state of charge of the low-voltage vehicle battery, and the electric energy parameter threshold includes a battery voltage threshold and a state of charge threshold; and if the battery voltage is less than or equal to the battery voltage threshold and the state of charge is greater than or equal to the state of charge threshold, determining that the capacity of the low-voltage vehicle battery is anomalous. In this implementation, the low-voltage vehicle battery whose capacity is anomalous is identified based on the battery voltage threshold and the state of charge threshold, so that a user can replace the low-voltage vehicle battery in time, thereby avoiding the following case: The vehicle cannot be normally started due to the anomalous capacity of the low-voltage vehicle battery. The battery voltage threshold and the state of charge threshold may be flexibly set by those skilled in the art according to actual requirements.

Further, the electric energy-related parameter in the battery anomaly analysis request is an electric energy-related parameter that is detected by the vehicle device, for example, a body control module, at an instantaneous moment when charging of the low-voltage vehicle battery is started during the vehicle standstill and after it is detected that the battery voltage of the low-voltage vehicle battery is less than or equal to the preset voltage threshold. In this implementation, during the vehicle standstill and if it is detected that the battery voltage of the low-voltage vehicle battery is less than or equal to the preset voltage threshold, it indicates that the battery voltage of the low-voltage vehicle battery is insufficient to start a vehicle, and the low-voltage vehicle battery needs to be charged. The battery voltage of the low-voltage vehicle battery drops within a short time due to an excessive battery load at a moment when the low-voltage vehicle battery is charged, and values of the electric energy-related parameters (namely, the battery voltage and the state of charge) of the low-voltage vehicle battery are the lowest at this moment. In this case, if the battery voltage is less than or equal to the battery voltage threshold and the state of charge is greater than or equal to the state of charge threshold, the low-voltage vehicle battery may be unable to start the vehicle. Therefore, the low-voltage vehicle battery whose capacity is anomalous is identified in advance, so that the user can replace the low-voltage vehicle battery in time, thereby avoiding the following case: The vehicle cannot be normally started due to the anomalous capacity of the low-voltage vehicle battery.

In an implementation, after the step (step S102) of determining, based on a result of comparison between the electric energy-related parameter and a preset electric energy parameter threshold, whether a capacity of the low-voltage vehicle battery is anomalous, the foregoing monitoring method further includes: obtaining vehicle identification information from the battery anomaly analysis request if it is determined that the capacity of the low-voltage vehicle battery is anomalous, and sending alarm information to a vehicle service terminal and/or a vehicle user terminal based on the vehicle identification information. In this implementation, if the vehicle has been started, the alarm information may be sent to a display of the vehicle and/or a mobile phone of the user. If the vehicle has not been started, the alarm information may be sent to the mobile phone of the user and/or the alarm information may be sent to the display of the vehicle after a next start of the vehicle, so that the user can replace the low-voltage vehicle battery in time, thereby avoiding the following case: The vehicle cannot be normally started due to the anomalous capacity of the low-voltage vehicle battery. The vehicle identification information may be information that can be used for distinguishing between vehicles, for example, a license plate number.

In an implementation, the foregoing monitoring method further includes: obtaining historical status data of a traction battery in a vehicle; and adjusting, based on the historical status data, a charging strategy for using the traction battery to charge the low-voltage vehicle battery, which specifically includes: adjusting a charging voltage, a state of charge at the start of the charging, and a state of charge at the end of the charging of the low-voltage vehicle battery based on the historical status data, where the historical status data includes a service life and a mileage of the traction battery as well as charging duration and a temperature of the low-voltage vehicle battery when the traction battery is used to charge the low-voltage vehicle battery. In this implementation, if the capacity of the low-voltage vehicle battery is anomalous, the charging strategy for using the traction battery to charge the low-voltage vehicle battery may be wrong, which causes the service life of the low-voltage vehicle battery to be shortened. In this case, the charging voltage, the state of charge at the start of the charging, and the state of charge at the end of the charging of the low-voltage vehicle battery may be adjusted based on the historical status data of the traction battery charging the low-voltage vehicle battery, thereby prolonging the service life of the low-voltage vehicle battery. In a possible implementation, if it is found that a battery capacity of a low-voltage vehicle battery is anomalous, a service life and a mileage of a traction battery for charging the low-voltage vehicle battery as well as charging duration and a temperature of the low-voltage vehicle battery are obtained. If the service life of the traction battery is shorter than those of other traction batteries, a mileage loss is greater, and the charging duration of the low-voltage vehicle battery is longer, it indicates that a charging voltage used by the traction battery to charge the low-voltage vehicle battery is lower, and passivation may occur in the low-voltage vehicle battery, resulting in the anomalous capacity. In this case, the charging voltage needs to be appropriately increased, and the charging strategy for using the traction battery to charge the low-voltage vehicle battery needs to be adjusted.

In this embodiment of the invention, the battery anomaly analysis request can be output by the vehicle device during the vehicle standstill and when it is detected that the battery voltage of the low-voltage vehicle battery is less than or equal to the preset voltage threshold, and the electric energy-related parameter (including but not limited to the battery voltage and the state of charge) of the low-voltage vehicle battery is obtained from the battery anomaly analysis request, so that whether the capacity of the low-voltage vehicle battery is anomalous can be determined based on the result of comparison between the electric energy-related parameter and the preset electric energy parameter threshold. Specifically, if the battery voltage is less than or equal to the battery voltage threshold and the state of charge is greater than or equal to the state of charge threshold, it is determined that the capacity of the low-voltage vehicle battery is anomalous. In this way, the low-voltage vehicle battery whose capacity is anomalous can be identified in advance, so that a user can take measures in time, thereby avoiding the following case: The vehicle cannot be normally started due to the anomalous capacity of the low-voltage vehicle battery.

It should be noted that although the steps are described in a specific order in the foregoing embodiment, those skilled in the art can understand that in order to achieve the effects of the invention, different steps are not necessarily performed in this order, but may be performed simultaneously (in parallel) or in another order, and these variations all fall within the scope of protection of the invention.

Embodiment 2

Figure 2:
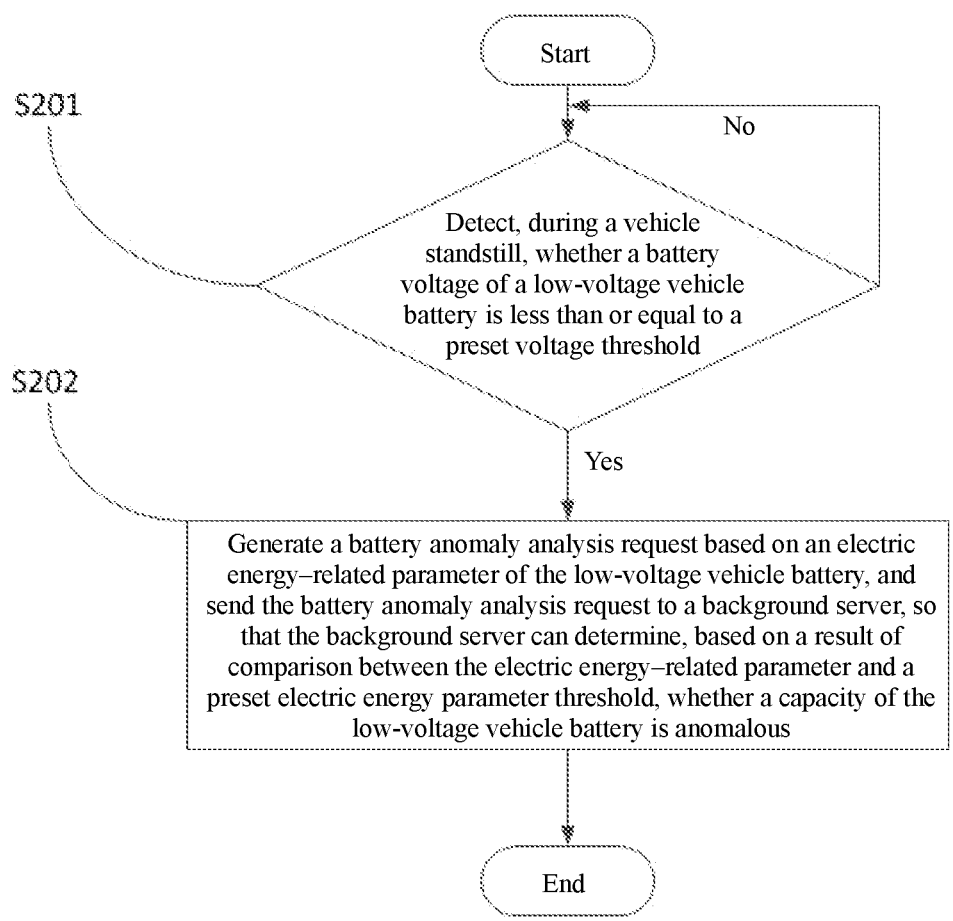
FIG. 2 is a schematic flowchart of main steps of a monitoring method for a low-voltage vehicle battery according to Embodiment 2 of the invention.

Referring to FIG. 2, FIG. 2 is a schematic flowchart of main steps of a monitoring method for a low-voltage vehicle battery according to another embodiment of the invention. As shown in FIG. 2, the monitoring method in this embodiment of the invention mainly includes the following steps.

In step S201, during a vehicle standstill, whether a battery voltage of the low-voltage vehicle battery is less than or equal to a preset voltage threshold is detected; and if the battery voltage of the low-voltage vehicle battery is less than or equal to the preset voltage threshold, the method proceeds to step S202.

In this embodiment, "vehicle standstill" has a same meaning as that in the foregoing term explanation. For brevity, details are not described herein again. The preset voltage threshold may be flexibly set by those skilled in the art according to actual requirements.

In step S202, a battery anomaly analysis request is generated based on an electric energy-related parameter of the low-voltage vehicle battery, and the battery anomaly analysis request is sent to a background server, so that the background server can determine, based on a result of comparison between the electric energy-related parameter and a preset electric energy parameter threshold, whether a capacity of the low-voltage vehicle battery is anomalous.

In this embodiment, the electric energy-related parameter includes but is not limited to: the battery voltage and a state of charge that are related to electric energy of the low-voltage vehicle battery. The preset electric energy parameter threshold may be flexibly set by those skilled in the art according to actual requirements.

Through the foregoing steps S201 and S202, in this embodiment of the invention, during the vehicle standstill and when it is detected that the battery voltage of the low-voltage vehicle battery is less than or equal to the preset voltage threshold, it is determined that the capacity of the low-voltage vehicle battery may be anomalous. Therefore, the electric energy-related parameters such as the battery voltage and the state of charge of the low-voltage vehicle battery are immediately obtained, and the battery anomaly analysis request is output based on the electric energy-related parameters. After receiving the battery anomaly analysis request, a device, for example, a background server, determines, based on a result of comparison between the electric energy-related parameter of the low-voltage vehicle battery in the battery anomaly analysis request and the preset electric energy parameter threshold, whether the capacity of the low-voltage vehicle battery is anomalous, and selectively outputs alarm information based on a determination result. Therefore, the low-voltage vehicle battery whose capacity is anomalous can be identified in advance, so that a user can take measures in time, thereby overcoming a defect that a vehicle cannot be normally started due to the anomalous capacity of the low-voltage vehicle battery.

The foregoing step S202 is further described below.

In an implementation, the step of generating a battery anomaly analysis request based on an electric energy-related parameter of the low-voltage vehicle battery specifically includes: obtaining a battery temperature and the electric energy-related parameter of the low-voltage vehicle battery, and vehicle identification information of a current vehicle; and generating the battery anomaly analysis request based on the battery temperature, the electric energy-related parameter, and the vehicle identification information, so that the background server can obtain, through matching based on a preset correspondence between a battery temperature and an electric energy parameter threshold, an electric energy parameter threshold corresponding to the battery temperature, and determine, based on a result of comparison between the electric energy-related parameter and the electric energy parameter threshold, whether the capacity of the low-voltage vehicle battery is anomalous. In this implementation, different battery temperatures of the low-voltage vehicle battery respectively correspond to different electric energy parameter thresholds, and therefore, an electric energy parameter threshold, used in the case of a normal battery capacity, corresponding to the battery temperature of the low-voltage vehicle battery in the battery anomaly analysis request can be obtained based on the preset correspondence between a battery temperature and an electric energy parameter threshold. The low-voltage vehicle battery whose capacity is anomalous can be identified based on the battery voltage threshold and the state of charge threshold, so that a user can replace the low-voltage vehicle battery in time, thereby avoiding the following case: The vehicle cannot be normally started due to the anomalous capacity of the low-voltage vehicle battery.

In this implementation, the preset correspondence between a battery temperature and an electric energy parameter threshold may be flexibly set by those skilled in the art according to actual requirements. For example, when a battery temperature of the low-voltage vehicle battery is 25° C., a corresponding battery voltage is 12.5 V, and a corresponding state of charge (SOC) is 0.9. Similarly, the battery voltage threshold and the state of charge threshold may be flexibly set by those skilled in the art according to actual requirements.

In an implementation, after the step of sending the battery anomaly analysis request to a background server, the foregoing monitoring method further includes: receiving alarm information sent by the background server, where the alarm information is information sent by the background server after the background server determines that the capacity of the low-voltage vehicle battery is anomalous. In this implementation, if the vehicle has been started, the alarm information may be displayed on a display of the vehicle. If the vehicle has not been started, the alarm information may be displayed on the display of the vehicle after a next start of the vehicle, so that the user can replace the low-voltage vehicle battery in time, thereby avoiding the following case: The vehicle cannot be normally started due to the anomalous capacity of the low-voltage vehicle battery. The vehicle identification information may be information that can be used for distinguishing between vehicles, for example, a license plate number.

In an implementation, the electric energy-related parameter includes the battery voltage and a state of charge of the low-voltage vehicle battery, where the electric energy-related parameter is an electric energy-related parameter that is detected at an instantaneous moment when charging of the low-voltage vehicle battery is started during the vehicle standstill and after it is detected that the battery voltage of the low-voltage vehicle battery is less than or equal to the preset voltage threshold. In this implementation, during the vehicle standstill and if it is detected that the battery voltage of the low-voltage vehicle battery is less than or equal to the preset voltage threshold, it indicates that the battery voltage of the low-voltage vehicle battery is insufficient to start a vehicle, and the low-voltage vehicle battery needs to be charged. The battery voltage of the low-voltage vehicle battery drops within a short time due to an excessive battery load at a moment when the low-voltage vehicle battery is charged, and values of the electric energy-related parameters (namely, the battery voltage and the state of charge) of the low-voltage vehicle battery are the lowest at this moment. In this case, if the battery voltage is less than or equal to the battery voltage threshold and the state of charge is greater than or equal to the state of charge threshold, the low-voltage vehicle battery may be unable to start the vehicle. Therefore, the low-voltage vehicle battery whose capacity is anomalous is identified in advance, so that the user can replace the low-voltage vehicle battery in time, thereby avoiding the following case: The vehicle cannot be normally started due to the anomalous capacity of the low-voltage vehicle battery.

In this embodiment of the invention, the battery anomaly analysis request can be output by the vehicle device during the vehicle standstill and when it is detected that the battery voltage of the low-voltage vehicle battery is less than or equal to the preset voltage threshold, and the electric energy-related parameter (including but not limited to the battery voltage and the state of charge) of the low-voltage vehicle battery is obtained from the battery anomaly analysis request, so that whether the capacity of the low-voltage vehicle battery is anomalous can be determined based on the result of comparison between the electric energy-related parameter and the preset electric energy parameter threshold. Specifically, if the battery voltage is less than or equal to the battery voltage threshold and the state of charge is greater than or equal to the state of charge threshold, it is determined that the capacity of the low-voltage vehicle battery is anomalous. In this way, the low-voltage vehicle battery whose capacity is anomalous can be identified in advance, so that a user can take measures in time, thereby avoiding the following case: The vehicle cannot be normally started due to the anomalous capacity of the low-voltage vehicle battery.

It should be noted that although the steps are described in a specific order in the foregoing embodiment, those skilled in the art can understand that in order to achieve the effects of the invention, different steps are not necessarily performed in this order, but may be performed simultaneously (in parallel) or in another order, and these variations all fall within the scope of protection of the invention.

Further, the invention further provides a background server.

Figure 3:
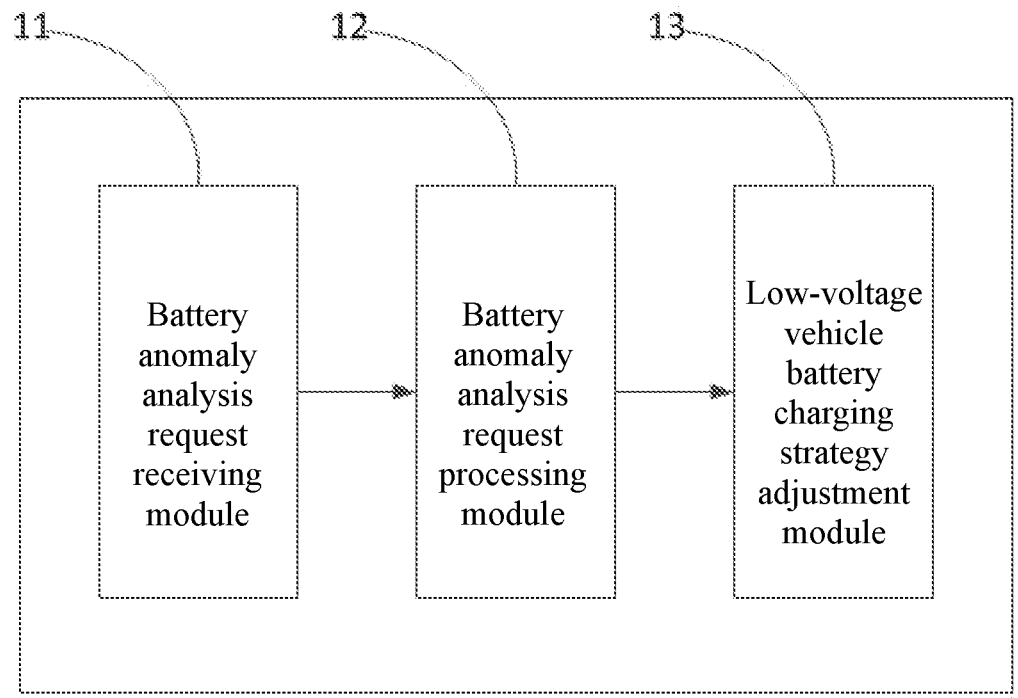
FIG. 3 is a block diagram of a main structure of a background server according to Embodiment 1 of the invention.

Referring to FIG. 3, FIG. 3 is a block diagram of a main structure of a background server according to Embodiment 1 of the invention. As shown in FIG. 3, the background server in this embodiment of the invention mainly includes a battery anomaly analysis request receiving module 11 and a battery anomaly analysis request processing module 12. In some embodiments, one or more of the battery anomaly analysis request receiving module 11 and the battery anomaly analysis request processing module 12 may be combined into one module. In some embodiments, the battery anomaly analysis request receiving module 11 may be configured to obtain, in response to a received battery anomaly analysis request, an electric energy-related parameter of a low-voltage vehicle battery from the battery anomaly analysis request, where the battery anomaly analysis request is request information output by a vehicle device during a vehicle standstill and when it is detected that a battery voltage of the low-voltage vehicle battery is less than or equal to a preset voltage threshold. The battery anomaly analysis request processing module 12 may be configured to determine, based on a result of comparison between the electric energy-related parameter and a preset electric energy parameter threshold, whether a capacity of the low-voltage vehicle battery is anomalous. In an implementation, for the detailed description of function implementation, reference may be made to the description of steps S101 and S102.

In an implementation, the battery anomaly analysis request processing module 12 is further configured to perform the following steps: obtaining a battery temperature of the low-voltage vehicle battery from the battery anomaly analysis request; and obtaining, through matching based on a preset correspondence between a battery temperature and an electric energy parameter threshold, an electric energy parameter threshold corresponding to the battery temperature. In an implementation, for the detailed description of function implementation, reference may be made to the description of step S102.

In an implementation, the battery anomaly analysis request processing module 12 is further configured to perform the following step: the electric energy-related parameter includes a battery voltage and a state of charge of the low-voltage vehicle battery, and the electric energy parameter threshold includes a battery voltage threshold and a state of charge threshold; and if the battery voltage is less than or equal to the battery voltage threshold and the state of charge is greater than or equal to the state of charge threshold, determining that the capacity of the low-voltage vehicle battery is anomalous. In an implementation, for the detailed description of function implementation, reference may be made to the description of step S102.

In an implementation, the electric energy-related parameter in the battery anomaly analysis request is an electric energy-related parameter that is detected by the vehicle device at an instantaneous moment when charging of the low-voltage vehicle battery is started during the vehicle standstill and after it is detected that the battery voltage of the low-voltage vehicle battery is less than or equal to the preset voltage threshold. In an implementation, for the detailed description of function implementation, reference may be made to the description of step S102.

In an implementation, the battery anomaly analysis request processing module 12 is further configured to perform the following steps: obtaining vehicle identification information from the battery anomaly analysis request if it is determined that the capacity of the low-voltage vehicle battery is anomalous, and sending alarm information to a vehicle service terminal and/or a vehicle user terminal based on the vehicle identification information. In an implementation, for the detailed description of function implementation, reference may be made to the description of step S102.

In an implementation, the foregoing background server further includes a low-voltage vehicle battery charging strategy adjustment module 13, and the low-voltage vehicle battery charging strategy adjustment module 13 is configured to perform the following steps: obtaining historical status data of a traction battery in a vehicle; and adjusting, based on the historical status data, a charging strategy for using the traction battery to charge the low-voltage vehicle battery, which specifically includes: adjusting a charging voltage, a state of charge at the start of the charging, and a state of charge at the end of the charging of the low-voltage vehicle battery based on the historical status data, where the historical status data includes a service life and a mileage of the traction battery as well as charging duration and a temperature of the low-voltage vehicle battery when the traction battery is used to charge the low-voltage vehicle battery. In an implementation, for the detailed description of function implementation, reference may be made to the description of step S102.

The foregoing background server is used to implement the embodiment of the monitoring method for the low-voltage vehicle battery shown in FIG. 1. The technical principles, technical problems solved, and technical effects produced by the background server and the monitoring method are similar, and those skilled in the art can clearly understand, for convenience and brevity of the description, for a specific working process and a related description of the background server, refer to the content described in the embodiment of the monitoring method for the low-voltage vehicle battery (Embodiment 1), and details are not described herein again.

Further, the invention further provides a monitoring device for a low-voltage vehicle battery.

Figure 4:
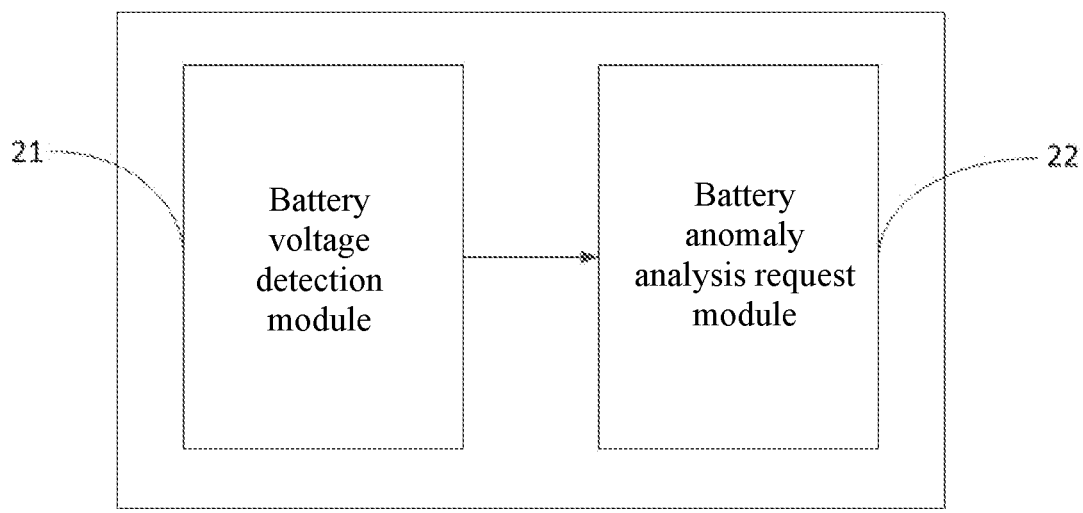
FIG. 4 is a block diagram of a main structure of a monitoring device for a low-voltage vehicle battery according to Embodiment 2 of the invention.

Referring to FIG. 4, FIG. 4 is a block diagram of a main structure of a monitoring device for a low-voltage vehicle battery according to Embodiment 2 of the invention. As shown in FIG. 4, the monitoring device in this embodiment of the invention mainly includes a battery voltage detection module 21 and a battery anomaly analysis request module 22. In some embodiments, one or more of the battery voltage detection module 21 and the battery anomaly analysis request module 22 may be combined into one module. In some embodiments, the battery voltage detection module 21 may be configured to detect, during a vehicle standstill, whether a battery voltage of the low-voltage vehicle battery is less than or equal to a preset voltage threshold. The battery anomaly analysis request module 22 may be configured to: when the battery voltage detection module detects that the battery voltage of the low-voltage vehicle battery is less than or equal to the preset voltage threshold, generate a battery anomaly analysis request based on an electric energy-related parameter of the low-voltage vehicle battery, and send the battery anomaly analysis request to a background server, so that the background server can determine, based on a result of comparison between the electric energy-related parameter and a preset electric energy parameter threshold, whether a capacity of the low-voltage vehicle battery is anomalous. In an implementation, for the detailed description of function implementation, reference may be made to the description of steps S201 and S202.

In an implementation, the battery anomaly analysis request module 22 is further configured to perform the following steps: obtaining a battery temperature and the electric energy-related parameter of the low-voltage vehicle battery, and vehicle identification information of a current vehicle; and generating the battery anomaly analysis request based on the battery temperature, the electric energy-related parameter, and the vehicle identification information, so that the background server can obtain, through matching based on a preset correspondence between a battery temperature and an electric energy parameter threshold, an electric energy parameter threshold corresponding to the battery temperature, and determine, based on a result of comparison between the electric energy-related parameter and the electric energy parameter threshold, whether the capacity of the low-voltage vehicle battery is anomalous. In an implementation, for the detailed description of function implementation, reference may be made to the description of step S202.

In an implementation, the battery anomaly analysis request module 22 is further configured to perform the following step: receiving alarm information sent by the background server, where the alarm information is information sent by the background server after the background server determines that the capacity of the low-voltage vehicle battery is anomalous. In an implementation, for the detailed description of function implementation, reference may be made to the description of step S202.

In an implementation, the electric energy-related parameter includes the battery voltage and a state of charge of the low-voltage vehicle battery, where the electric energy-related parameter is an electric energy-related parameter that is detected at an instantaneous moment when charging of the low-voltage vehicle battery is started during the vehicle standstill and after it is detected that the battery voltage of the low-voltage vehicle battery is less than or equal to the preset voltage threshold. In an implementation, for the detailed description of function implementation, reference may be made to the description of step S202.

In an implementation, the battery voltage detection module 21 includes a body control module (BCM), and the battery anomaly analysis request module 22 includes a vehicle control unit (VCU). In an implementation, for the detailed description of function implementation, reference may be made to the description of step S202.

The foregoing monitoring device for the low-voltage vehicle battery is used to implement the embodiment of the monitoring method for the low-voltage vehicle battery shown in FIG. 3. The technical principles, technical problems solved, and technical effects produced by the monitoring device and the monitoring method are similar, and those skilled in the art can clearly understand, for convenience and brevity of the description, for a specific working process and a related description of the monitoring device for the low-voltage vehicle battery, refer to the content described in the embodiment of the monitoring method for the low-voltage vehicle battery (Embodiment 2), and details are not described herein again.

Further, the invention further provides a monitoring system for a low-voltage vehicle battery.

In an embodiment of the monitoring system for the low-voltage vehicle battery according to the invention, the monitoring system for the low-voltage vehicle battery may include the background server in the foregoing embodiments and the monitoring device for the low-voltage vehicle battery in the foregoing embodiments. The monitoring device may be configured to: detect, during a vehicle standstill, whether a battery voltage of the low-voltage vehicle battery is less than or equal to a preset voltage threshold; and if the battery voltage of the low-voltage vehicle battery is less than or equal to the preset voltage threshold, generate a battery anomaly analysis request based on an electric energy-related parameter of the low-voltage vehicle battery, and send the battery anomaly analysis request to the background server. The background server may be configured to: obtain the electric energy-related parameter of the low-voltage vehicle battery from the battery anomaly analysis request, and determine, based on a result of comparison between the electric energy-related parameter and a preset electric energy parameter threshold, whether a capacity of the low-voltage vehicle battery is anomalous. It should be noted that, for a specific working process and a related description of the monitoring system for the low-voltage vehicle battery, refer to the content described in the embodiment of the background server and the embodiment of the monitoring device for the low-voltage vehicle battery, and details are not described herein again.

Those skilled in the art can understand that some or all of the procedures of the invention in the methods of the foregoing embodiments may also be implemented by a computer program instructing relevant hardware. The computer program may be stored in a computer-readable storage medium. The computer program, when executed by a processor, may implement the steps of the foregoing method embodiments. The computer program includes computer program code, and the computer program code may be in the form of source code, object code, executable file, or some intermediate forms. The computer-readable medium may include: any entity or device, medium, USB flash disk, removable hard disk, magnetic disk, optical disc, computer memory, read-only memory, random access memory, electrical carrier signal, telecommunications signal, software distribution medium, etc. that can carry the computer program code. It should be noted that the content included in the computer-readable medium can be appropriately added or deleted depending on requirements of the legislation and patent practice in a jurisdiction. For example, in some jurisdictions, according to the legislation and patent practice, the computer-readable medium does not include an electrical carrier signal and a telecommunications signal.

Further, the invention further provides a control device.

In an embodiment of the control device according to the invention, the control device includes a processor and a storage device. The storage device may be configured to store a program that executes the monitoring method for the low-voltage vehicle battery in the foregoing method Embodiment 1, and the processor may be configured to execute the program in the storage device. The program includes, but is not limited to, the program that executes the monitoring method for the low-voltage vehicle battery in the foregoing method embodiment. For ease of description, only parts related to the embodiment of the invention are shown. For specific technical details that are not disclosed, refer to the method part of the embodiments of the invention. The control device may be a control device formed by various electronic devices.

In another embodiment of the control device according to the invention, the control device includes a processor and a storage device. The storage device may be configured to store a program that executes the monitoring method for the low-voltage vehicle battery in the foregoing method Embodiment 2, and the processor may be configured to execute the program in the storage device. The program includes, but is not limited to, the program that executes the monitoring method for the low-voltage vehicle battery in the foregoing method embodiment. For ease of description, only parts related to the embodiment of the invention are shown. For specific technical details that are not disclosed, refer to the method part of the embodiments of the invention. The control device may be a control device formed by various electronic devices.

Further, the invention further provides a computer-readable storage medium.

In an embodiment of the computer-readable storage medium according to the invention, the computer-readable storage medium may be configured to store a program that executes the monitoring method for the low-voltage vehicle battery in the foregoing method Embodiment 1, and the program may be loaded and run by a processor to implement the foregoing monitoring method for the low-voltage vehicle battery. For ease of description, only parts related to the embodiment of the invention are shown. For specific technical details that are not disclosed, refer to the method part of the embodiments of the invention. The computer-readable storage medium may be a storage device formed by various electronic devices. Optionally, the storage in this embodiment of the invention is a non-transitory computer-readable storage medium.

In another embodiment of the computer-readable storage medium according to the invention, the computer-readable storage medium may be configured to store a program that executes the monitoring method for the low-voltage vehicle battery in the foregoing method Embodiment 2, and the program may be loaded and run by a processor to implement the foregoing monitoring method for the low-voltage vehicle battery. For ease of description, only parts related to the embodiment of the invention are shown. For specific technical details that are not disclosed, refer to the method part of the embodiments of the invention. The computer-readable storage medium may be a storage device formed by various electronic devices. Optionally, the storage in this embodiment of the invention is a non-transitory computer-readable storage medium.

Further, it should be understood that, since the configuration of the modules is merely intended to illustrate functional units of a system of the invention, a physical device corresponding to these modules may be a processor itself, or part of software, part of hardware, or part of a combination of software and hardware in the processor. Therefore, the number of modules in the figure is merely illustrative.

Those skilled in the art can understand that the modules in the system may be adaptively split or combined. Such a split or combination of specific modules does not cause the technical solutions to depart from the principle of the invention. Therefore, the technical solutions after the split or combination will all fall within the scope of protection of the invention.

Heretofore, the technical solutions of the invention have been described with reference to an embodiment as shown in the accompanying drawings. However, it would have been readily understood by those skilled in the art that the scope of protection of the invention is obviously not limited to these specific embodiments. Those skilled in the art could make equivalent changes or substitutions to the related technical features without departing from the principles of the invention, and all the technical solutions after the changes or the substitutions fall within the scope of protection of the invention.

The invention claimed is:

1. A monitoring method for a low-voltage vehicle battery, wherein the monitoring method comprises:
    obtaining, in response to a received battery anomaly analysis request, an electric energy-related parameter of the low-voltage vehicle battery from the battery anomaly analysis request; and
    determining, based on a result of comparison between the electric energy-related parameter and a preset electric energy parameter threshold, whether a capacity of the low-voltage vehicle battery is anomalous,
    wherein the battery anomaly analysis request is request information output by a vehicle device during a vehicle standstill and when it is detected that a battery voltage of the low-voltage vehicle battery is less than or equal to a preset voltage threshold,
    the electric energy-related parameter comprises a battery voltage and a state of charge of the low-voltage vehicle battery, and the electric energy parameter threshold comprises a battery voltage threshold and a state of charge threshold.

2. The monitoring method for the low-voltage vehicle battery according to claim 1, wherein before the step of determining, based on a result of comparison between the electric energy-related parameter and a preset electric energy parameter threshold, whether a capacity of the low-voltage vehicle battery is anomalous, the monitoring method further comprises:
    obtaining a battery temperature of the low-voltage vehicle battery from the battery anomaly analysis request; and
    obtaining, through matching based on a preset correspondence between a battery temperature and an electric energy parameter threshold, an electric energy parameter threshold corresponding to the battery temperature.

3. The monitoring method for the low-voltage vehicle battery according to claim 1, wherein the step of determining, based on a result of comparison between the electric energy-related parameter and a preset electric energy parameter threshold, whether a capacity of the low-voltage vehicle battery is anomalous specifically comprises:
    if the battery voltage is less than or equal to the battery voltage threshold and the state of charge is greater than or equal to the state of charge threshold, determining that the capacity of the low-voltage vehicle battery is anomalous.

4. The monitoring method for the low-voltage vehicle battery according to claim 3, wherein the electric energy-related parameter in the battery anomaly analysis request is an electric energy-related parameter that is detected by the vehicle device at an instantaneous moment when charging of the low-voltage vehicle battery is started during the vehicle standstill and after it is detected that the battery voltage of the low-voltage vehicle battery is less than or equal to the preset voltage threshold.

5. The monitoring method for the low-voltage vehicle battery according to claim 1, wherein after the step of determining, based on a result of comparison between the electric energy-related parameter and a preset electric energy parameter threshold, whether a capacity of the low-voltage vehicle battery is anomalous, the monitoring method further comprises:
    obtaining vehicle identification information from the battery anomaly analysis request if it is determined that the capacity of the low-voltage vehicle battery is anomalous, and sending alarm information to a vehicle service terminal and/or a vehicle user terminal based on the vehicle identification information.

6. The monitoring method for the low-voltage vehicle battery according to claim 1, wherein the monitoring method further comprises:
    obtaining historical status data of a traction battery in a vehicle; and
    adjusting, based on the historical status data, a charging strategy for using the traction battery to charge the low-voltage vehicle battery, which specifically comprises:
    adjusting a charging voltage, a state of charge at the start of the charging, and a state of charge at the end of the charging of the low-voltage vehicle battery based on the historical status data,
    wherein the historical status data comprises a service life and a mileage of the traction battery as well as charging duration and a temperature of the low-voltage vehicle battery when the traction battery is used to charge the low-voltage vehicle battery.

7. The monitoring method for the low-voltage vehicle battery according to claim 1, wherein the monitoring method comprises:
    detecting, during a vehicle standstill, whether a battery voltage of the low-voltage vehicle battery is less than or equal to a preset voltage threshold; and
    if the battery voltage of the low-voltage vehicle battery is less than or equal to the preset voltage threshold, generating a battery anomaly analysis request based on an electric energy-related parameter of the low-voltage vehicle battery, and sending the battery anomaly analysis request to a background server, so that the background server is able to determine, based on a result of comparison between the electric energy-related parameter and a preset electric energy parameter threshold, whether a capacity of the low-voltage vehicle battery is anomalous.

8. The monitoring method for the low-voltage vehicle battery according to claim 7, wherein the step of generating a battery anomaly analysis request based on an electric energy-related parameter of the low-voltage vehicle battery specifically comprises:

obtaining a battery temperature and the electric energy-related parameter of the low-voltage vehicle battery, and vehicle identification information of a current vehicle; and generating the battery anomaly analysis request based on the battery temperature, the electric energy-related parameter, and the vehicle identification information, so that the background server is able to obtain, through matching based on a preset correspondence between a battery temperature and an electric energy parameter threshold, an electric energy parameter threshold corresponding to the battery temperature, and determine, based on a result of comparison between the electric energy-related parameter and the electric energy parameter threshold, whether the capacity of the low-voltage vehicle battery is anomalous.

9. The monitoring method for the low-voltage vehicle battery according to claim 7, wherein after the step of sending the battery anomaly analysis request to a background server, the monitoring method further comprises:

receiving alarm information sent by the background server, wherein the alarm information is information sent by the background server after the background server determines that the capacity of the low-voltage vehicle battery is anomalous.

10. The monitoring method for the low-voltage vehicle battery according to claim 7, wherein the electric energy-related parameter comprises the battery voltage and a state of charge of the low-voltage vehicle battery, wherein the electric energy-related parameter is an electric energy-related parameter that is detected at an instantaneous moment when charging of the low-voltage vehicle battery is started during the vehicle standstill and after it is detected that the battery voltage of the low-voltage vehicle battery is less than or equal to the preset voltage threshold.

11. A control device comprising a processor and a storage device, wherein the storage device stores multiple program codes thereon which, when loaded and executed by the processor, cause the processor to implement the monitoring method for the low-voltage vehicle battery according to claim 1.

12. A computer-readable storage medium storing multiple program codes thereon which, when loaded and executed by a processor, cause the processor to implement the monitoring method for the low-voltage vehicle battery according to claim 1.

* * * * *